United States Patent [19]
Deen et al.

[11] Patent Number: 5,498,885
[45] Date of Patent: Mar. 12, 1996

[54] MODULATION CIRCUIT

[75] Inventors: M. Jamal Deen, Coquitlam; Duljit S. Malhi, Kanata; Zhixin Yan, Burnaby; Robert A. Hadaway, Dunrobin, all of Canada

[73] Assignee: Northern Telecom Limited, Montreal, Canada

[21] Appl. No.: 313,575

[22] Filed: Sep. 26, 1994

[51] Int. Cl.$^6$ .............................. H01L 29/74; H03F 3/38; H03C 3/00
[52] U.S. Cl. .......................... 257/139; 257/141; 257/378; 330/10; 330/299; 330/300; 332/117; 332/135
[58] Field of Search ..................................... 257/139, 141, 257/378; 330/10, 299, 300; 332/117, 135

[56] References Cited

U.S. PATENT DOCUMENTS

| | | | |
|---|---|---|---|
| 4,541,123 | 9/1985 | Saka | 455/325 |
| 4,967,246 | 10/1990 | Tanaka | 257/141 |
| 5,151,625 | 9/1992 | Zarabadi et al. | 307/529 |

FOREIGN PATENT DOCUMENTS 2261130  5/1993  United Kingdom.

OTHER PUBLICATIONS

N. Camilleri et al "Silicon MOSFETs, the Microwave Device Technology for the 90s" 1991 IEEE MTT-S Digest pp. 545-548.

S. Maas "Microwave Mixers" published by Artech House, Norwood MA (1986)—Table of Contents only.

A. M. Pavio et al "Double Balanced Mixers Using Active and Passive Techniques" IEEE Transactions on Microwave Theory and Techniques, vol. 36, No. 12, Dec. 1988 pp. 1948–1957.

R. Hadaway et al "A Sub–Micron BiCMOS Technology for Telecommunications" Microelectronic Engineering 15 (1991) 513–516 Elseview.

*Primary Examiner*—Edward Wojciechowicz
*Attorney, Agent, or Firm*—Angela C. de Wilton

[57] ABSTRACT

An integrated circuit is provided with particular application for high frequency modulation circuits, such as a mixer circuit, with reduced noise and gain. The circuit provides a novel application of a single device comprising a 4 or 5 terminal, gate controlled lateral bipolar junction transistor device, in the form of a merged MOS and lateral bipolar transistor. In a grounded base configuration, RF and LO signals are applied to the gate and emitter terminals respectively and provide for modulated output at the collector, and provides signal modulation with reduced noise compared with multi-device implementations of known mixer circuits using a summation circuit, diodes and FETs. Advantageously, operation of the device in the grounded base or grounded emitter configuration provides for strong modulation of the DC current gain, i.e. over 4 decades, as a function of gate voltage.

11 Claims, 9 Drawing Sheets

5,498,885

MODULATION CIRCUIT

RELATED APPLICATIONS

This application is related to copending U.S. Pat. application Ser. No. 08/310,003 (Malhi-1 CIP) filed Sep. 24, 1994, which is a continuation-in-part of U.S. Pat. application Ser. No. 08/163,636, filed Dec. 9, 1993 entitled "Semiconductor Device for an Integrated Circuit."

FIELD OF THE INVENTION

This invention relates to modulation circuit, and in particular to application of a gate controlled lateral bipolar junction transistor (GCLBJT) as a mixer circuit.

BACKGROUND OF THE INVENTION

A conventional known active mixer circuit is typically formed using a diode, a bipolar junction transistor (BJT), or a GaAs field effect transistor (FET). To combine both RF and LO signals for mixing, inputs must first be combined using a summation circuit. Conventional mixer circuits are reviewed, for example, in an article by A. M Pavio et al. entitled "Double balanced mixers using active and passive techniques", in IEEE Trans. on Microwave Theory and Techniques MTT Vol. 36, no. 12 (Dec. 1988); and in a book by S. Maas entitled "Microwave Mixers" published by Artech House, Norwood Mass. (1986). Of course, each active element in a circuit contributes noise, and ideally a simplified circuit with fewer components is sought.

Thus, the present invention seeks to provide an integrated circuit with reduced noise characteristics and with particular application for mixing signals and modulating high frequency signals in a simple manner with minimal components.

A four or five terminal semiconductor device taking the form of a merged field effect/lateral bipolar junction transistor, which is termed a Gate Controlled Lateral Bipolar Junction Transistor, GCLBJT is described in copending U.S. patent application to Malhi et. al., having two co-inventors in common with those of present invention, which relates to an application of this device.

SUMMARY OF THE INVENTION

According to one aspect of the present invention there is provided an integrated circuit for modulating signals comprising:

a four terminal GCLBJT semiconductor device formed on a semiconductor substrate, said device having the form of a merged lateral bipolar transistor and FET, comprising an emitter region, a collector region, a base region extending laterally therebetween, and a gate electrode extending over the base region between the emitter and collector, said four terminals being provided to the emitter, base, collector and gate respectively, means for providing a first input (RF) signal to the one of the emitter and base terminals, the other said terminal being grounded, and means for providing a second input (LO) signal to the gate terminal, whereby during operation of the device, an output (IF) signal is generated at the collector terminal which is a result of the gate voltage controlled modulation of the first input RF signal and the second input LO signal.

Thus a simple circuit for modulating 2 signals is provided using only 1 active device, that is, a GCLBJT device. Thus a novel use of a GCLBJT device is provided as a modulation circuit or mixer circuit which results in reduction in noise and improved conversion gain compared with known mixer circuits.

As described in detail in the copending patent application to Malhi, the GCLBJT device functions as a merged bipolar field effect device having a emitter/source, a collector/drain base/MOS channel region, and a gate electrode overlying the base/channel. The device operation is functionally equivalent to a PMOS transistor having a source, gate and drain, in parallel with a lateral PNP BJT having an emitter, base and collector. The fourth (gate) terminal provides for application of a signal to the gate to modulate the collector current. A fifth terminal may be provided to the substrate, if required.

Operation of the device in a grounded base configuration ($V_b=0$) or grounded emitter configuration ($V_e=0$) provides advantages for design of high frequency modulation circuits, such as a mixer circuit, using a reduced number of active components.

In the grounded base configuration, the device is configured as a 4 terminal device, with the base connected to the substrate, and provides for input of the RF and LO signals to the emitter and gate terminals respectively to generate output at the collector terminal. When the gate voltage is below the threshold voltage $V_t$ for turning on the channel of the PMOS transistor, the collector current $I_c$ is strongly controlled by both the base current $I_b$ and the gate voltage $V_g$. Thus the single device can replace a circuit having both voltage and current controlled functions. Modulation capability can be realized with lower noise and improved gain compared with conventional multiple device mixer circuits.

According to another aspect of the present invention there is provided a method of operating a 4 terminal GCLBJT as a modulation circuit, the GCLBJT comprising emitter, collector, base and gate terminals and the method comprising:

providing a first input (RF) signal to the one of the emitter and base terminals, the other of said terminals being grounded, providing a second input (LO) signal to the gate terminal, whereby during operation of the device, an output (IF) signal generated at the collector terminal which is a result of the gate voltage controlled modulation of the first input RF signal and the second input LO signal.

Advantageously, when gate voltage is Vgs is greater than the flatband voltage thereby turning off the MOS channel of the device, whereby the device operates predominantly as a lateral bipolar transistor in which the path of collector current Ic through the base region is controlled by the gate voltage, and is moved deeper into the substrate by increasing the magnitude of the gate voltage. This mode of operation is beneficial in reducing interface scattering, and reduces noise.

Beneficially, when the GCLBJT is structured as a merged PMOS/PNP LBJT device, and is operated in the region Vgs> flatband voltage and Vgs<Vt, the PMOS device is operated in weak inversion, and the thickness of the depletion layer being strongly dependent on the voltage across the gate and base region. Thus the lateral PNP device characteristics are strongly dependent on the gate voltage. For example, strong modulation of the DC current gain, over 4 decades, may be obtained.

Advantageously, the device is readily fabricated as part of an integrated circuit using typical known CMOS, or bipolar CMOS, process technology, with no additional processing steps. Thus integration of the GCLBJT device to provide a novel modulation/mixer circuit with other circuitry on the same chip, e.g. typically digital signal processing (DSP), memory and other analog functions, may be accomplished with known design and fabrication technology.

BRIEF DESCRIPTION OF THE DRAWINGS

Embodiments of the invention will now be described by way of example, with reference to the accompanying drawing, in which:

FIG. 2 shows a forward active Gummel Plot: $I_c$ vs. $V_e$ characteristics, as gate voltage is varied in the grounded base configuration;

FIG. 3 shows $H_{fe}$ (gain) vs. $V_e$ as a function of gate voltage in the grounded base configuration;

FIG. 4 shows a forward active Gummel Plot: $I_c$ vs. $V_b$ characteristics, as gate voltage is varied in the grounded emitter configuration;

FIG. 5 shows $H_{fe}$ (gain) vs. $V_b$ as a function of gate voltage in the grounded emitter configuration;

FIG. 6 shows the collector current $I_c$ vs. the gate voltage $V_g$ at varying emitter voltages in the grounded base configuration;

FIG. 7 shows $g_m$ (transconductance) vs. gate voltage $V_g$ in grounded base ($V_{b=0}$) configuration as $V_e$ is varied;

FIG. 8 shows the collector current $I_c$ vs. gate voltage $V_g$ in the grounded emitter ($V_e=0$) configuration as $V_b$ is varied;

FIG. 9 shows $g_m$ (transconductance) vs. gate voltage $V_g$ in the grounded emitter ($V_e=0$) configuration as $V_b$ is varied;

DESCRIPTION OF THE PREFERRED EMBODIMENTS

Figure 1:
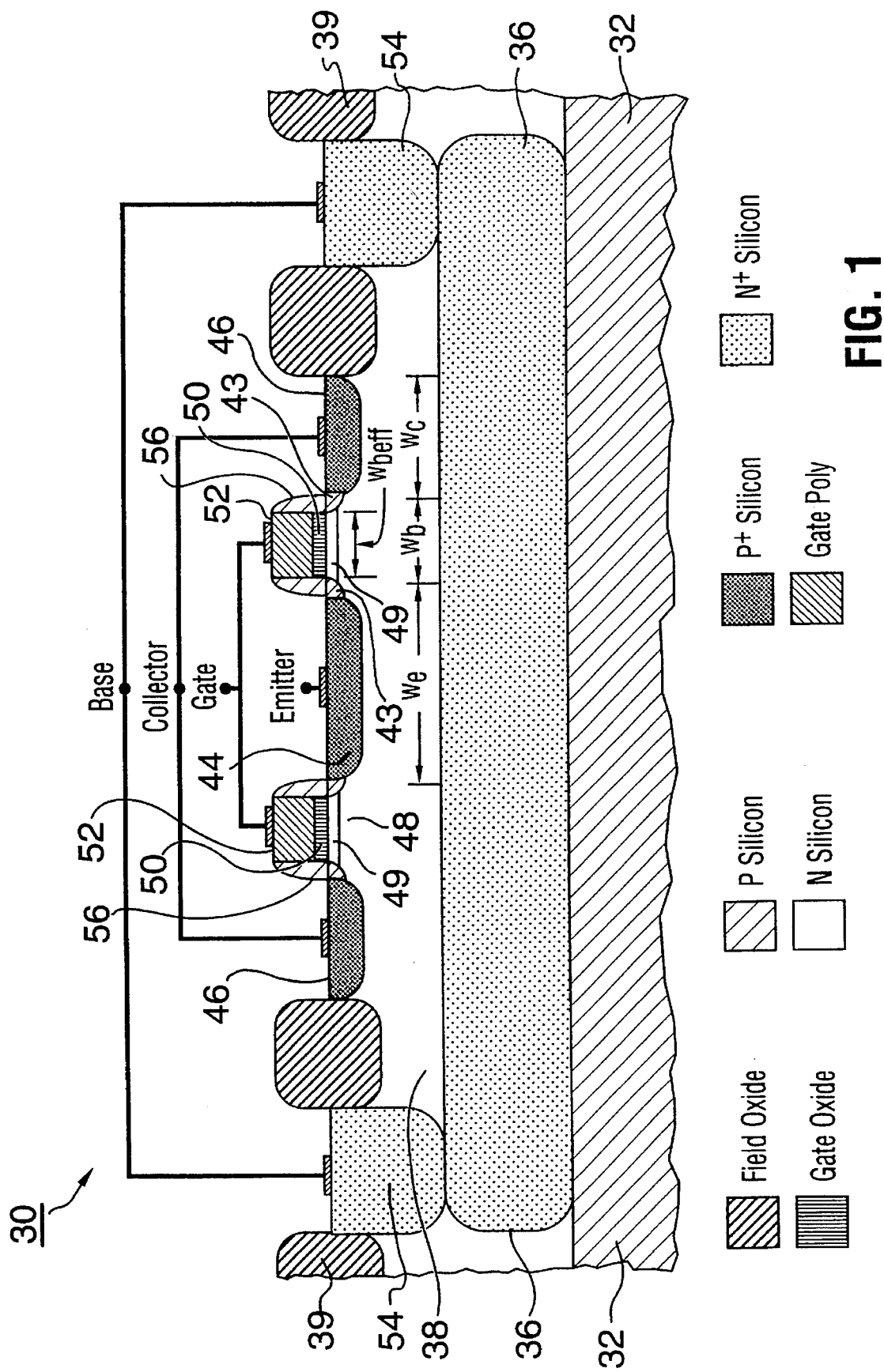
FIG. 1 shows a cross sectional diagram through part of an integrated circuit comprising gate controlled lateral bipolar transistor (GCLBJT) according to a first embodiment of the present invention.

A cross-sectional diagram of part of an integrated circuit comprising a semiconductor device 30 according to a first embodiment of the present invention is shown in FIG. 1, The semiconductor device 30 is a gate controlled lateral bipolar junction transistor (GCLBJT) which takes the form of a merged PMOS and lateral bipolar junction transistor, having 5 terminals, i.e.. emitter(source), collector(drain), base, gate and substrate. The device may be configured as a four terminal semiconductor device for implementation as a mixer circuit, i.e. with a grounded base configuration, as shown schematically in FIG. 10, and in a grounded emitter configuration as shown in FIG. 11. For other applications a fifth terminal (not shown) may be provided to the substrate if required.

The device structure of FIG. 1, and its fabrication, is described in detail in a copending U.S. patent application to Malhi (i.e. Malhi-1 CIP), which is incorporated herein by reference.

The GCLBJT 30 is formed on a semiconductor substrate comprising a lightly doped epitaxial layer 38 of a first conductivity type, with an underlying heavily doped buried layer 36 of the same conductivity type. A first heavily doped region 44 forms an emitter and laterally spaced apart, heavily doped regions 46 of a second conductivity type shown in FIG. 2 comprise parts of an annular collector. Part of the semiconductor layer extending between the emitter and collector forms the active base region 48 of the transistor. A base contact i.e. a sinker 54 is provided to part of the buried layer 36 which forms a buried base contact electrode underlying the active base region 48. A conductive layer 52 and an underlying gate oxide 50 forms a isolated gate electrode overlying the active base region 48. Dielectric sidewall spacers 56 are formed on the sidewalls of the gate electrode 52. Lightly doped regions 43 of the second conductivity type extend into the surface of the base region adjacent the heavily doped regions forming the emitter and collector. The lightly doped regions 43 underlie the dielectric sidewall spacers 56.

Thus it can be seen that the device may be viewed as a lateral bipolar transistor having emitter, base and collector terminals, plus a fourth gate electrode. Application of a signal to gate electrode influences the path of the collector current through the base region, and thereby has a significant effect on the operation of the device, as will be described below. Alternatively, the device may be seen as a MOSFET having source and drain regions provided by the heavily doped emitter and collector regions, a MOS channel through the surface of the active base region extending therebetween, and an additional buried base electrode. The lightly doped regions resemble the LDD regions formed in advanced MOS transistors and thus reduce the effective channel length of the surface MOS channel. However, these lightly doped regions 43 also influence the operation of the device as a bipolar transistor, reducing the effective base width of the lateral bipolar transistor. Furthermore, the surface of the region 49 under the gate is selectively implanted to control the threshold voltage of the surface MOS channel under the gate. Since the gate voltage influences the collector current path , thus the threshold adjust implant also influences the bipolar transistor characteristics as will be discussed below. Thus a gaze controlled lateral bipolar transistor structure is provided which includes features similar to those of an advance MOSFET structure using LDD technology, to improve its operation, particularly for analog applications.

Figure 2:
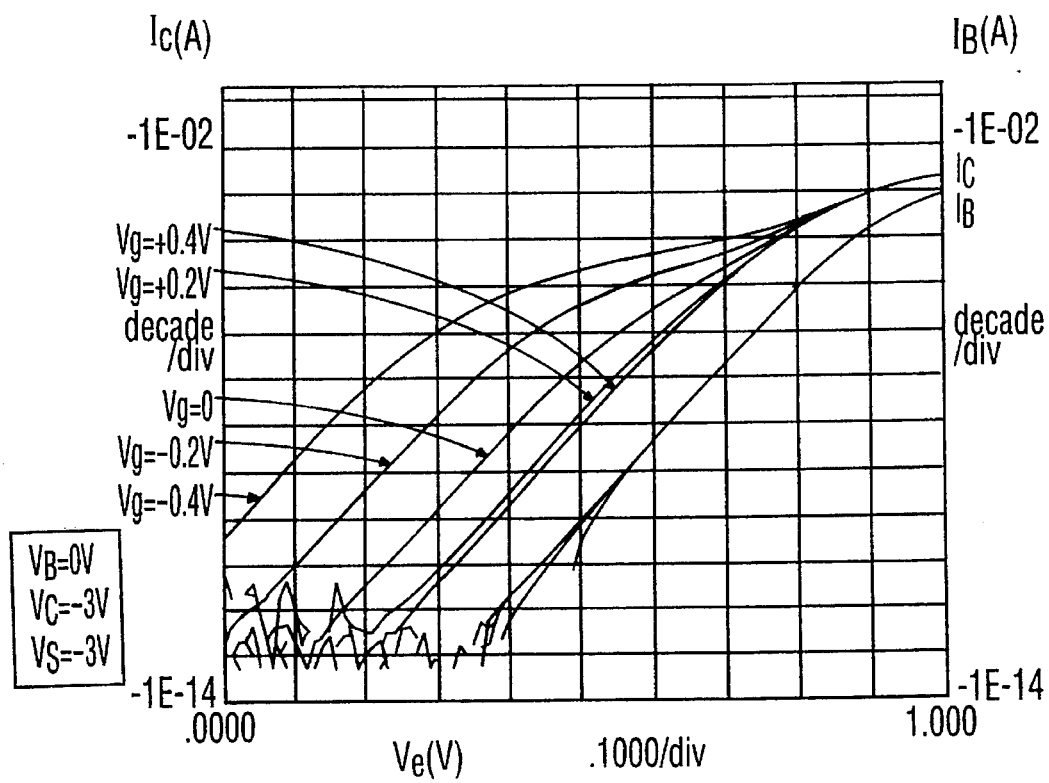
FIGS. 2 to 9 show typical I—V curves, and current gain and transconductance characteristics of the device shown in FIG. 1, in either a grounded emitter or a grounded base configuration, i.e.
Figure 3:
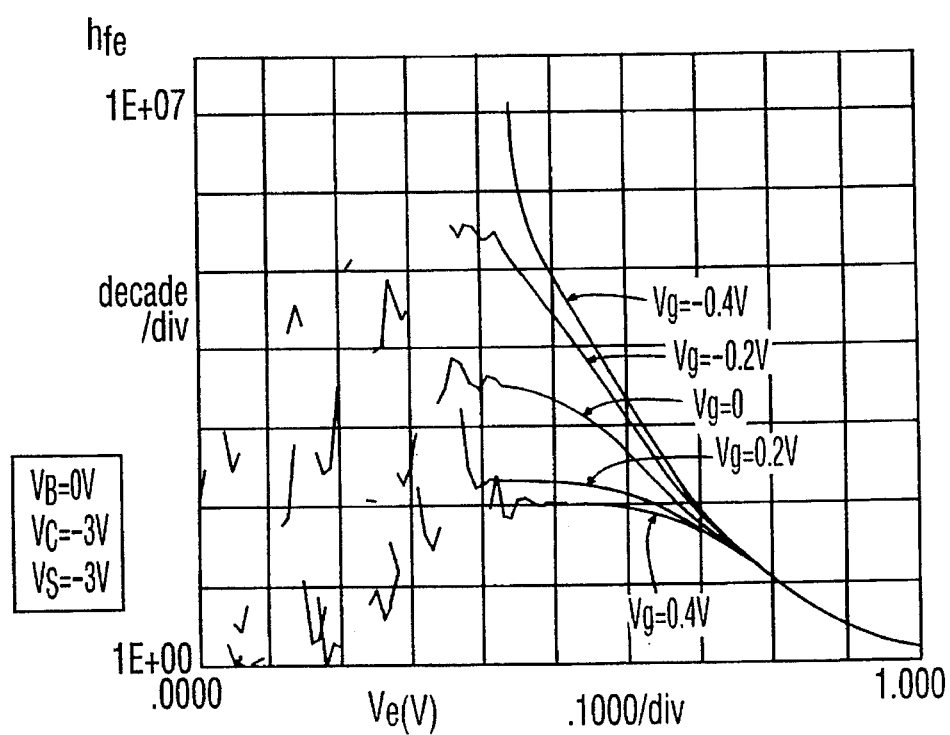
Figure 4:
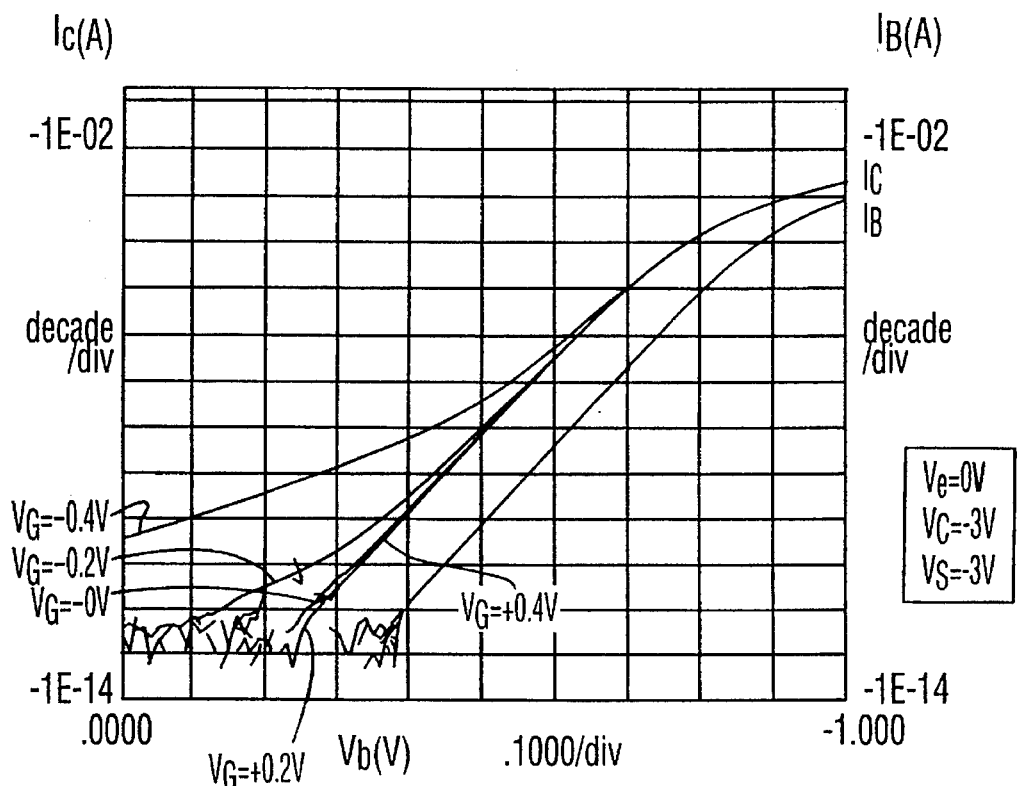
Figure 5:
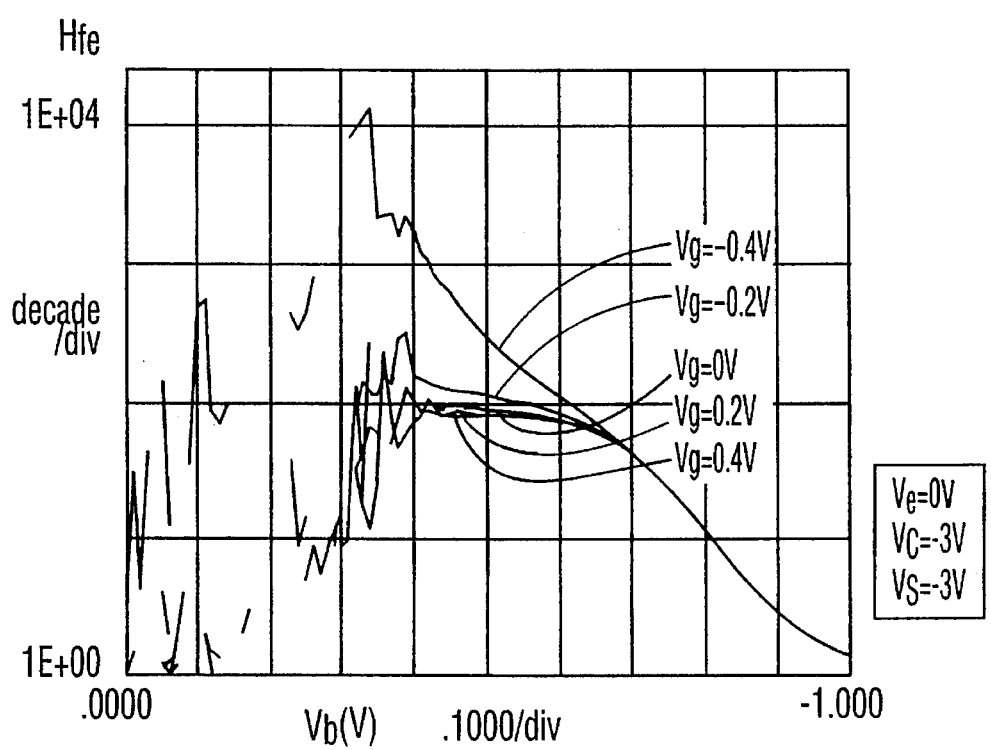
Figure 6:
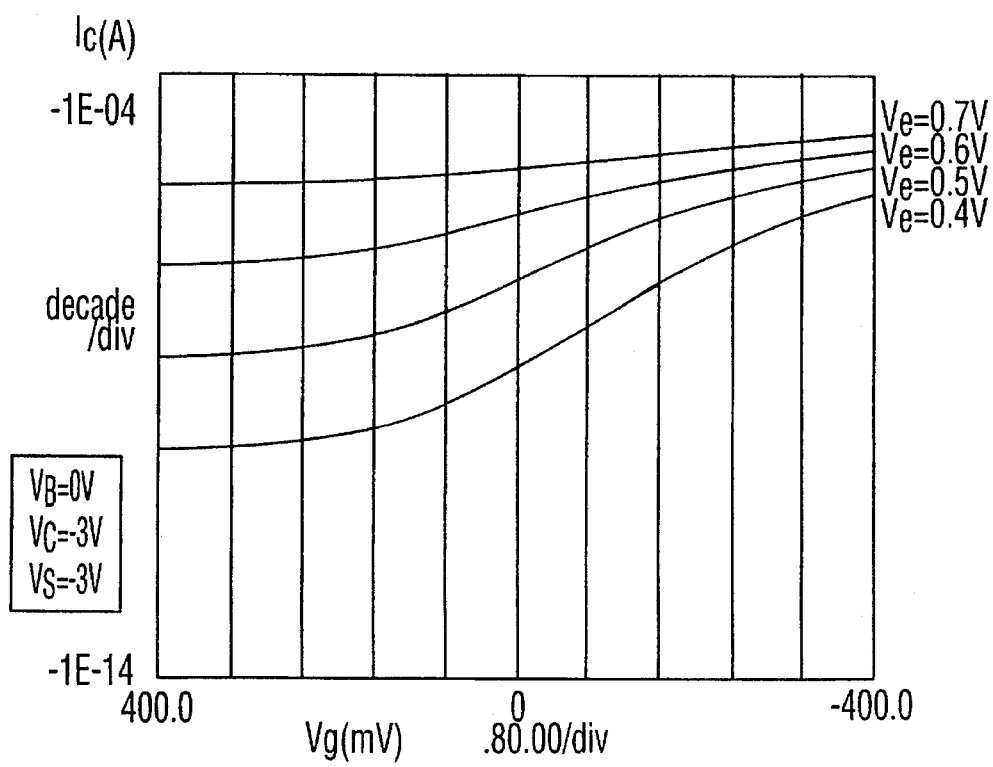
Figure 7:
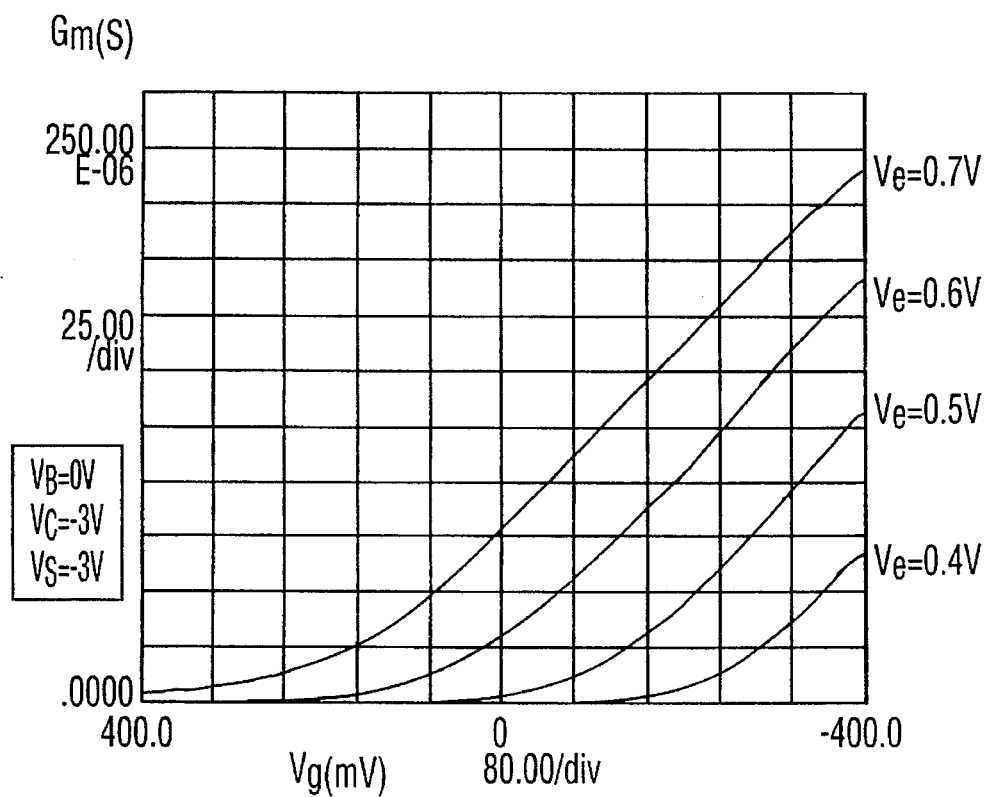
Figure 8:
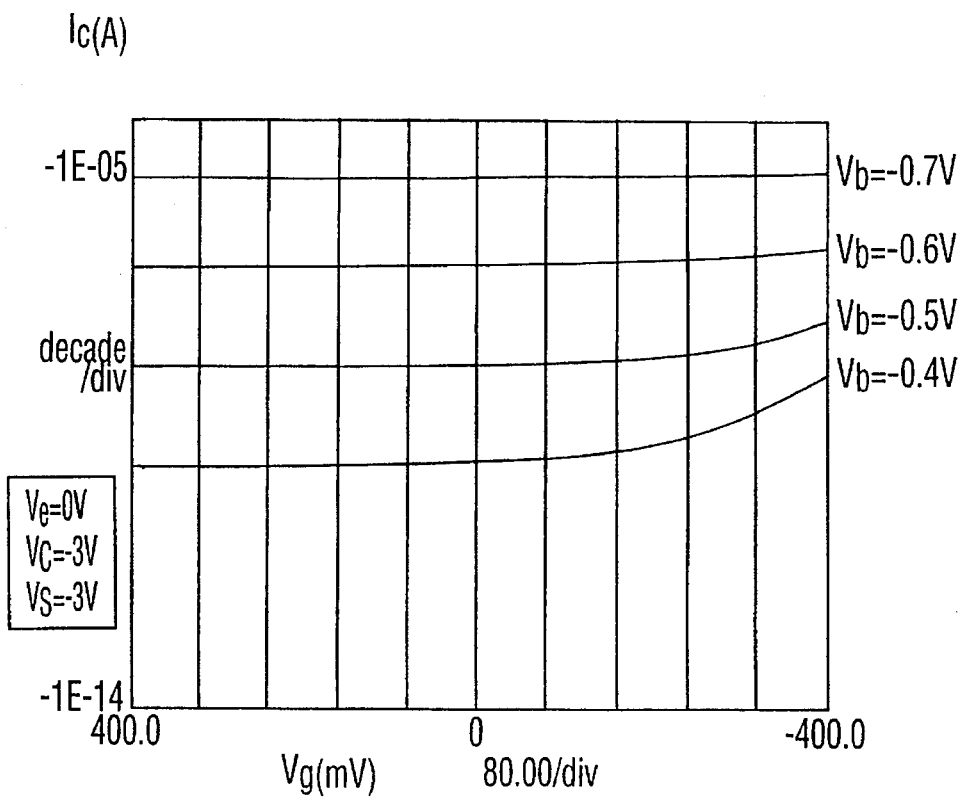
Figure 9:
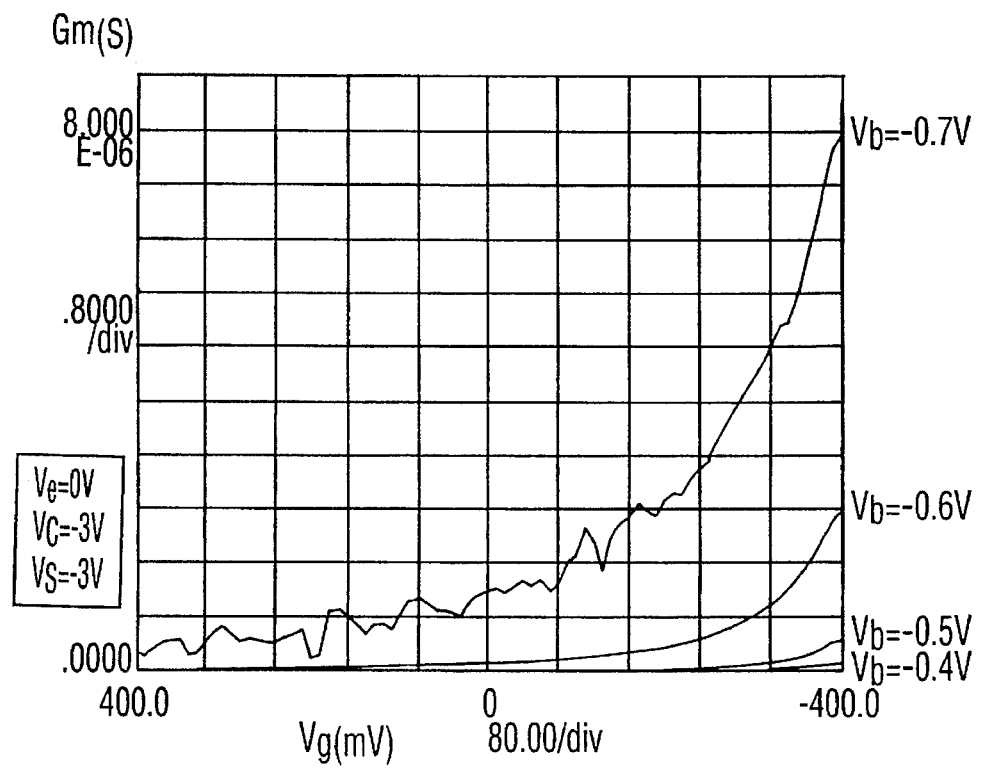

To illustrate the operation of a GCLBJT of the first embodiment as a 4 terminal device in an integrated circuit, typical characteristics of a test device are shown in FIGS. 3 to 12. Test devices were fabricated with a base length of 0.9 μm using an advanced 0.8 μm bipolar-CMOS process technology. The latter is described in an article by R. Hadaway et al., in Microelectronic Engineering 15 (1991) 513–516. The threshold voltage of the PMOS enhancement mode devices was about −0.6 V. Typical forward active Gummel plots, with gate voltage variation between +0.4 V to −0.4 V are shown in FIGS. 2 and 4 for grounded base and grounded emitter configurations, respectively.

Based on the device structure and measured I—V curves, the GCLBJT device shown in FIG. 1 can be visualized as functioning as a PMOS device (source/gate/drain) in parallel with a lateral PNP BJT (emitter/base/collector).

The key difference between the GCLBJT device of Malhi and a conventional known lateral PNP transistor is the presence of the gate electrode. A voltage is applied to the gate electrode formed above the base region. The electrode spans the base region between the emitter and collector regions, and provides for control of the collector current path through the base region.

The effect of the gate voltage on a GCLBJT merged PMOS/lateral PNP BJT device characteristics can be explained qualitatively as follows, by considering three regions of operation.

1. When the gate voltage $V_{gs}$ is larger than the flat band potential $V_{fb}$, i.e. typically, $V_{fb} > 0.0$ V for a PMOS transistor, an accumulation n-layer is formed under the gate. Thus the PMOS device is turned off, and only the pure lateral BJT transistor is operational. The thickness of the accumulation layer is very thin, i.e. 2 to 3 $L_D$, where $L_D$ Debye length, that is, approximately 40 nm for holes at room temperature. The accumulation layer is substantially independent of gate voltage variation. In comparison with a conventional lateral PNP, in the GCLBJT the accumulation layer near the surface under the gate, influences the path of the collector current $I_c$. Thus the collector current path, i.e. the path of mobile holes injected from the emitter, is moved deeper into the bulk of the base region under the gate. This has a beneficial effect, that is, interfacial oxide scattering under the gate is reduced resulting in reduced flicker noise.

2. When the Gate voltage is between $V_{fb}$ and the threshold voltage $V_t$, a wider depleted layer is formed under the gate and the PMOS device operates in weak inversion. The thickness of the depletion layer is strongly dependent on the voltage across the gate and base region. The depletion depth may extend through the whole depth of emitter/base and base/collector junction depth. Thus the lateral PNP device characteristics will be a strong function of the gate voltage. However the low flicker noise is maintained, as described above for $V_{gs} > V_{fb}$.

3. When $V_{gs}$ is larger than the $V_t$ (i.e. in absolute value) an inversion p layer is formed under the gate electrode and the device acts predominantly as a PMOS FET transistor rather than a bipolar transistor. This region is not of interest in the present application as a mixer or modulation circuit.

Thus in the following examples, operation of the four terminal GCLBJT takes advantage of the strong dependence of the collector current on the gate voltage when $V_g < V_t$, i.e. when the device is predominantly behaving as a lateral bipolar transistor, with the PMOS channel effectively off. Nevertheless, even when the PMOS channel is off, the gate voltage functions to modulate the current path of the collector current through the base region, i.e. in the substrate region underlying the gate electrode, which has a significant effect on the gain, transconductance, and noise characteristics of the device.

Advantages of using a grounded base configuration and grounded emitter configuration.

In testing the GCLBJT device for signal modulation, both the grounded base configuration and grounded emitter configuration were evaluated and demonstrated to have beneficial characteristics for operation for high frequency signal modulation.

For example, FIGS. 3, 7 and 5, 9 show the DC current gain $h_{fe}$ and the transconductance $g_m$ for the device in the grounded base and grounded emitter configurations, respectively. These two important DC performance characteristics are clearly modulated more strongly in the grounded base configuration. For example, the DC current gain at Vbe=−5 V with a gate voltage varying from +0.4 V to −0.4 V is over four decades of magnitude for the grounded base configuration, and less than 1 decade for the grounded emitter configuration.

In FIGS. 2 to 9, it can be seen that for low collector currents, $h_{fe}$ current gain is very large, $10^7$ in grounded base and $10^4$ in grounded emitter configuration, respectively. However at high collector currents, the transconductance, $g_m$, variation is very large. Therefore for analog circuits where large current gains and their variation are required, the GCLBJT can be used at low $I_c$.

For circuits requiring large transconductances and their variation, the GCLBJT can be used at high $I_c$. Therefore, the device has applications in a variety of analog circuits.

The reason for this difference in characteristics between grounded base configuration and grounded emitter configuration becomes clear upon consideration of how the structure of FIG. 1 operates. In the grounded base configuration, the base voltage $V_b$ is set at 0.0 V, (i.e. is tied to the substrate) and the effective voltage variation across the gate and base channel is equal to the difference between the gate voltage $V_g$ and the base voltage $V_b$. That is ($V_g - V_b$), which for $V_b = 0$ is, of course, the same as the modulation of the gate voltage $V_g$. On the other hand, in the grounded emitter mode, the voltage variation across the gate and base is shifted to $V_g - V_b$, or from +0.9 V to +0.1 V for a gate voltage range as above. Consequently there is a much stronger tendency to form an accumulation layer in the grounded emitter configuration than in the grounded base configuration, and the gate modulation capability is weakened, for the same gate voltage variation.

Furthermore, in high frequency operation, the Miller capacitance is a significant parameter. The Miller capacitance $C_{cb}$ in the grounded base configuration has much less effect than for the grounded emitter configuration. Thus the grounded base configuration is advantageous for high frequency modulation circuits such as the mixer circuit to be described below.

Example 1. Mixer circuit

A mixer circuit according to a first embodiment of the invention is shown schematically in FIG. 4. The circuit comprises a 4 terminal GCLBJT device as described above, having a grounded base configuration for reasons described above. The input RF signal $V_s$ is applied to the emitter terminal B. The local oscillator LO signal $V_{LO}$ is applied to the gate terminal G. The separation of the DC biasing and the AC signals for both RF and LO signals is implemented through the coupled capacitances $C_s$ (10 μF) and inductances $L_s$ (2 mH). This is equivalent to Bias-T. The two 50 ohm resistors between the emitter and gate and ground are added for matching to the output impedance of the signal generators. The load resistance (10 kohm) is chosen to approximately match the output impedance of the lateral PNP device. The output IF signal $V_{IF}$ is taken between the collector terminal C and ground.

For measurement of the characteristics shown in FIGS. 3 to 12, the two signal generators used were an HP8341B synthesized sweeper and an HP8660D synthesized signal generator. The output signal was measured on a TEK2782 spectrum analyzer, through as TEK2432A impedance transformer.

Mixing IF output results

Figure 10:
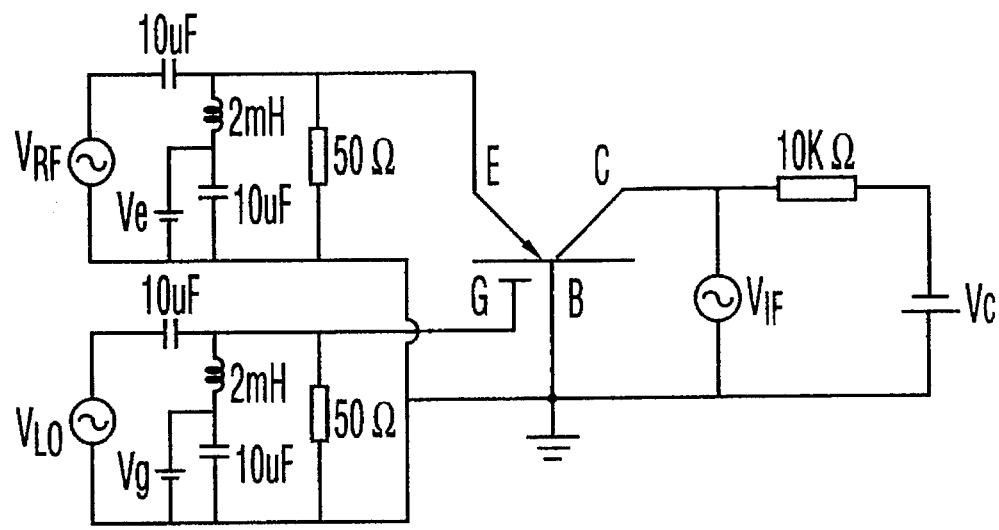
FIG. 10 shows a circuit schematic for a simple mixer circuit using a four terminal semiconductor device as shown in FIG. 1 in a grounded base configuration.
Figure 11:
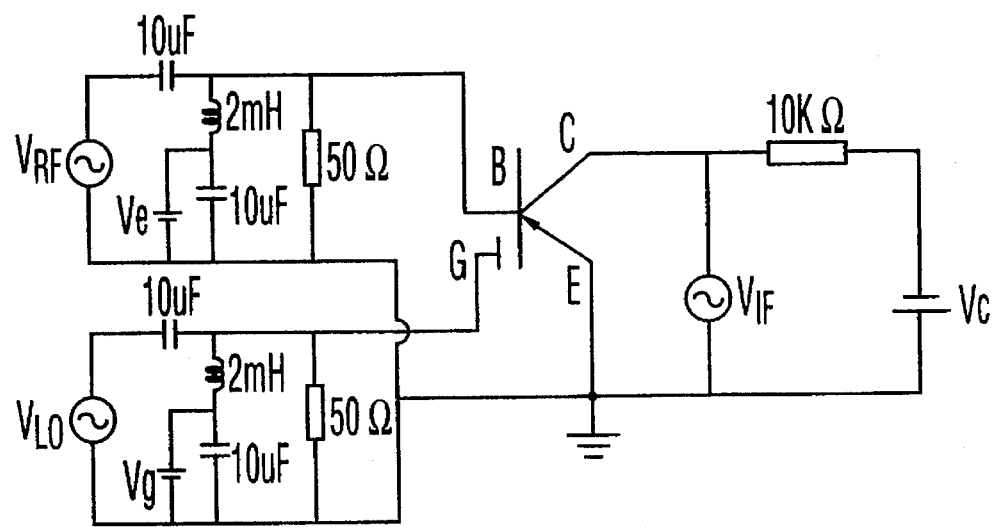
FIG. 11 shows a circuit schematic for a simple mixer circuit using a four terminal semiconductor device as shown in FIG. 1 in a grounded emitter configuration.
Figure 12:
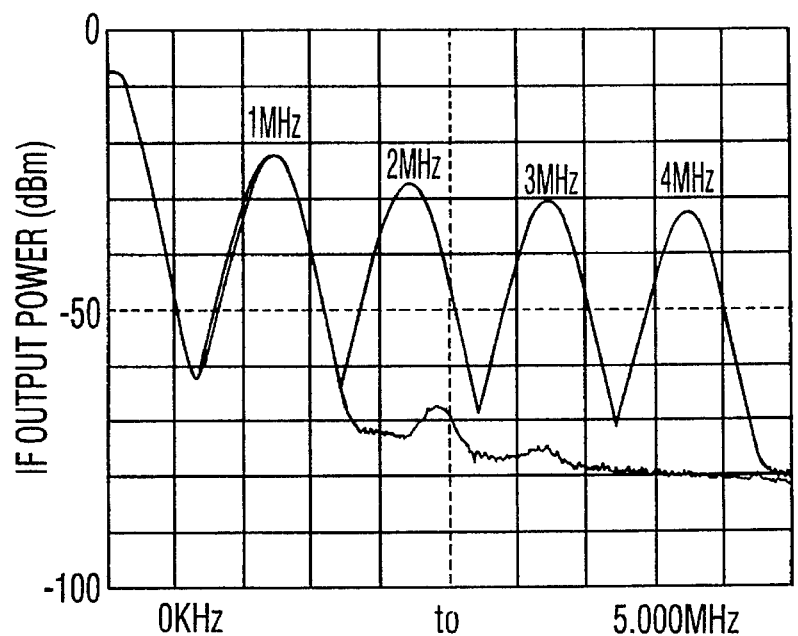
FIG. 12 shows the variation of IF (intermediate frequency) power with IF bandwidth of 1, 2, 3, 4 MHz. The biasing conditions were $V_b=0$ V, $V_e=-0.81$ V, $V_g=0$ V and $V_c=-3$ V; the signal frequency was 200 MHz and the power was −30 dBm; and the LO power was 3 dBm for a grounded base mixer.
Figure 13:
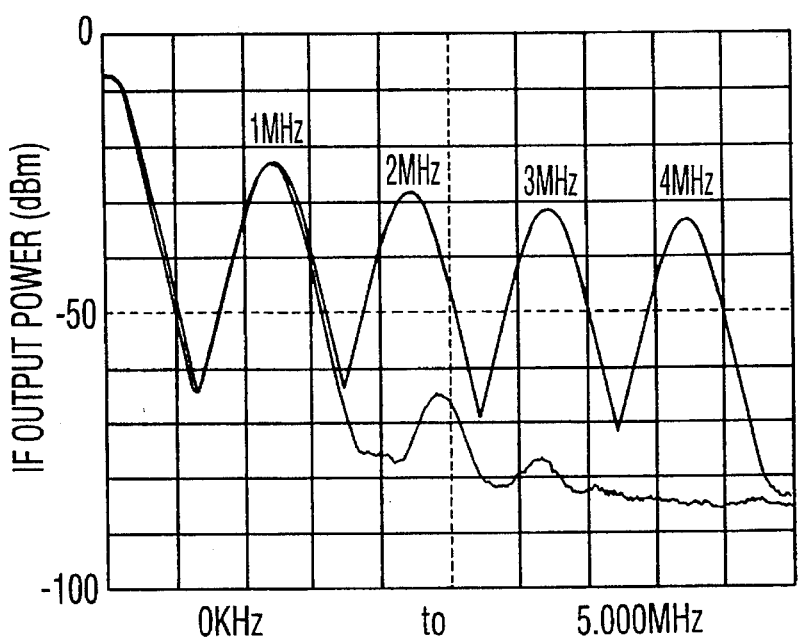
FIG. 13 shows the variation in IF power with IF bandwidth of 1, 2, 3, 4 MHz; The biasing conditions were $V_b=-0.81$ V, $V_e=0$ V, $V_g=0$ V, and $V_c=-3$ V; the signal frequency was 200 MHz and the power was −30 dBm, and the LO power was 3 dBm for a grounded emitter mixer.

FIGS. 12 and 13 demonstrate some measured results for the mixer circuit shown in FIG. 10. The graphs show the IF output power as a function of the intermediate frequency (IF) bandwidth Input RF signals were selected at 200 MHz with a fixed power level of $V_s=-30$ dBm (20 mV peak to peak value). The LO signal is selected to form the corresponding IF signal from 1 MHz to 4 MHz. The LO signal power $V_{LO}$ is chosen optimally to 3 dBm as will be explained below.

The mixed IF signal has a large signal to noise ratio, of about 40 dBm. The maximum IF signal (for $V_s=-30$ dBm) is about $-22$ dBm for IF=0.5 MHz and $-27$ dBm for IF= 2 MHz. Thus the conversion gain varies from about 8 dB to 3 dB respectively.

LO Dower dependence

Figure 14:
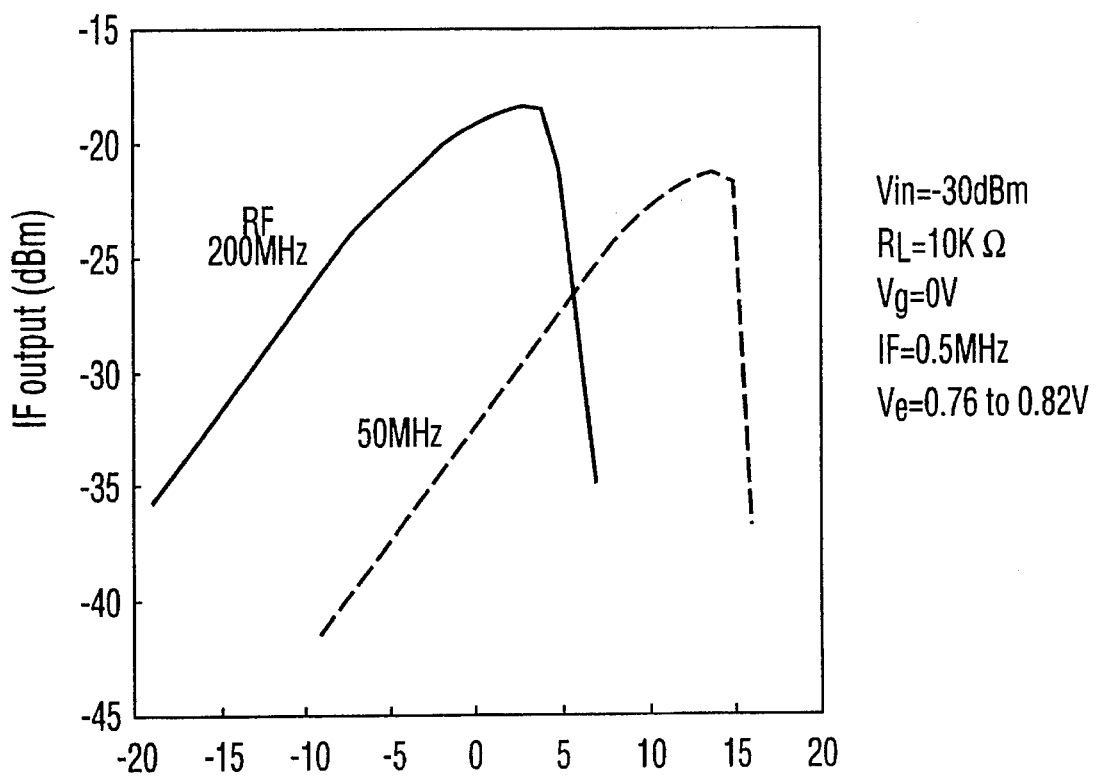
FIG. 14 shows the dependence of the IF output signal versus the LO signal power with $f_{RF}=200$ MHz, $V_s=-30$ dBm, and $f_{IF}=0.5$ MHz, $V_e=-0.76$ V to −0.82 V and $V_g=0$.

FIG. 14 shows the dependence of the IF output signal versus the LO signal power with $f_{RF}=50$ MHz and 200 MHz, $V_s=-30$ dBm at $F_{IF}=0.5$ MHz. The optimal LO signal power is dependent on the RF input frequency and also on the gate and emitter biasing conditions. As the curves indicate, the optimal LO signal power for maximum IF output at $F_{RF}=$ 200 MHz (solid line) and at $F_{RF}=50$ MHz (dashed line), is $P_{LO}=3$ dBm, $V_e=-0.81$ V, and $P_{LO}=14$ dBm, $V_e=0.83$ V respectively.

Frequency response characteristics

Figure 15:
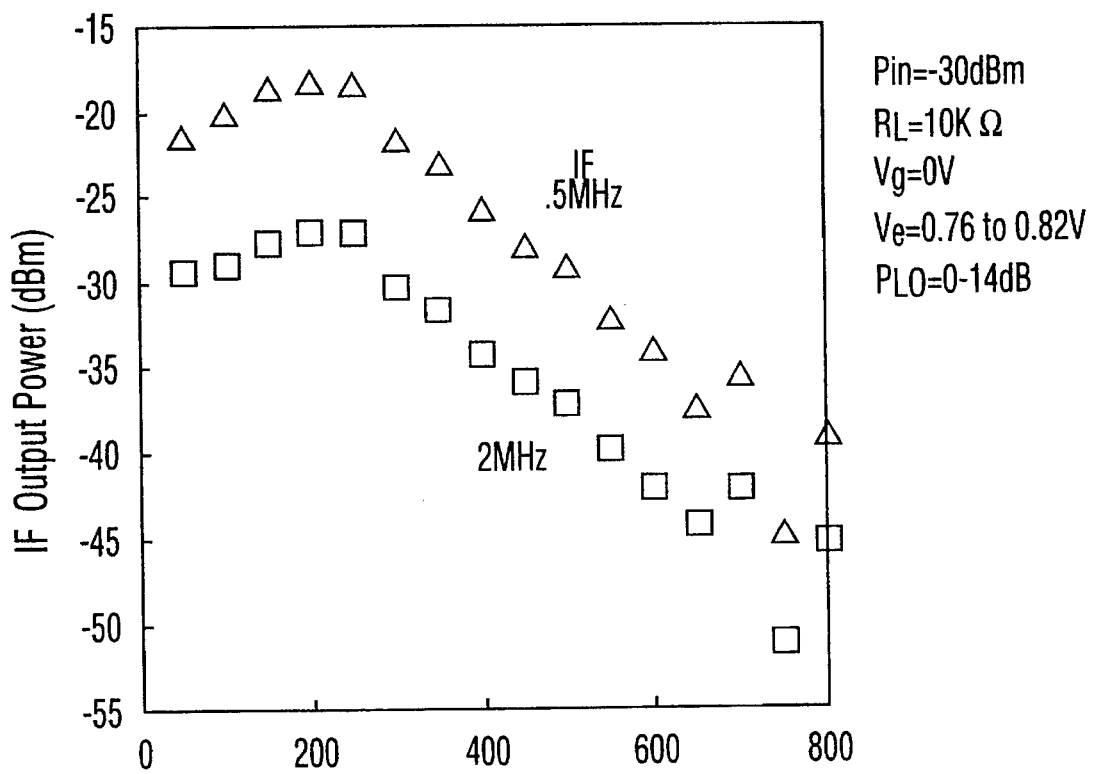
FIG. 15 shows the frequency response of the mixer IF output under the conditions described for FIG. 14.

FIG. 15 shows the frequency response of the mixed IF output for the above-mentioned conditions. The mixer circuit performs well for 0.5 MHz IF output at +12 dB to +5 dB conversion gain over the input RF range up to 400 MHz, with an optimal range in the 200 MHz region. The conversion gain is less than one for frequencies above 50 MHz when $f_{IF}=0.5$ MHz. Referring to FIG. 15, the IF output power is optimized mainly by adjusting the LO power and also by adjusting $V_e$ slightly for each RF input frequency as shown in FIG. 14.

Depending on the circuit application, and the desired frequency range of operation, an optimal set of element values for the biasing circuit can be determined so as to provide optimal mixing conversion and minimum noise.

Figure 16:
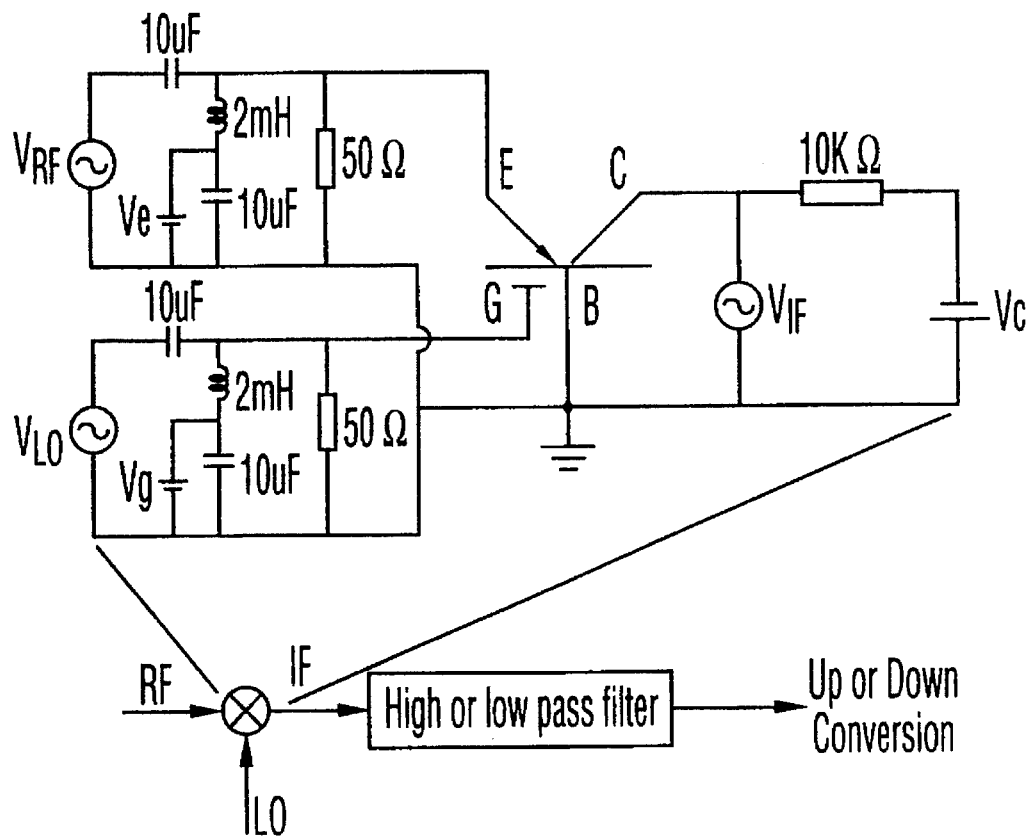
FIG. 16 shows schematically how a modulation circuit according to the first embodiment may be integrated with other circuit elements.

FIG. 16 shows schematically how a modulation circuit as described above may be integrated with other circuit elements.

What is claimed is:

1. A integrated circuit for modulating signals comprising:
   a four terminal gate controlled lateral bipolar junction transistor (GCLBJT) formed on semiconductor substrate, comprising an emitter region, a collector region, a base region extending laterally therebetween, and a gate electrode extending over the base region between the emitter and collector, said four terminals being provided to the emitter, base, collector and gate respectively,
   means for providing a first input signal to the one of the emitter and base terminals, the other said terminal being grounded, and means for providing a second input signal to the gate terminal, whereby during operation of the device, an output signal is generated at the collector terminal which is a result of the gate voltage controlled modulation of the first input signal and the second input signal 2. A structure according to claim 1 wherein the device is configured in a grounded base configuration, and the first input (RF) signal is provided to the emitter terminal, the second (LO) signal is provided to the gate terminal whereby the output (IF) signal is generated at the collector terminal.

3. A structure according to claim 1 wherein the device is configured in a grounded emitter configuration, and the first input (RF) signal is provided to the base terminal, the second (LO) signal is provided to the gate terminal whereby the output (IF) signal is generated at the collector terminal.

4. An integrated circuit structure according to claim 1 wherein the GCLBJT takes the form of a merged MOS and bipolar transistor device, formed on a semiconductor substrate of a first conductivity type, having a heavily doped buried layer defined therein forming a buried base electrode, first and second laterally spaced apart, heavily doped regions forming a source/emitter and a drain/collector of the merged field effect/bipolar transistor, and a channel/base region provided therebetween and a gate electrode formed on the surface of the channel region and isolated from the channel region by a gate oxide layer, the device thereby having four terminals, and the device being operable by application of a voltage Vg on the gate electrode, with Vg>vfb whereby the gate voltage modulates the collector current path through the base region under the gate electrode so that the application of a first input signal comprising an RF signal generates an output signal IF which is strongly modulated by the Vg as a result of LO input signal to the gate electrode.

5. A structure according to claim 4 wherein the threshold voltage of the MOS channel is determined by selectively doping the surface region of the substrate under the gate electrode.

6. A structure according to claim 4 wherein the effective MOS channel width and effective base width of the GCLBJT is controlled by lightly doped regions in the surface of the substrate adjacent the emitter and collector, said lightly doped regions being of the same conductivity type as the emitter and collector regions.

7. A method of operating a GCLBJT as a modulation circuit, the GCLBJT comprising emitter, collector, base and gate terminals and the method comprising:
   providing a first input (RF) signal to the one of the emitter and base terminals, the other of said terminals being grounded,
   providing a second input (LO) signal to the gate terminal,
   whereby during operation of the device, an output (IF) signal generated at the collector terminal which is a result of the gate voltage controlled modulation of the first input RF signal and the second input LO signal.

8. A method according to claim 7 wherein the device is configured in grounded base mode to be operable to function as a mixer circuit by application of the first signal to the emitter terminal, the second (LO) signal to the gate terminal, thereby generating the modulated (IF) signal at the collector terminal.

9. A method according to claim 7 wherein the device is configured in grounded emitter mode to be operable to function as a mixer circuit by application of the first signal to the base terminal, the second (LO) signal to the gate terminal, thereby generating the modulated (IF) signal at the collector terminal.

10. A method according to claim 7 wherein the gate voltage is Vgs is greater than the flatband voltage thereby turning off the MOS channel of the device, whereby the device operates predominantly as a lateral bipolar transistor in which the path of collector current Ic through the base region is controlled by the gate voltage, and is moved deeper into the substrate by increasing the magnitude of the gate voltage.

11. A method according to claim 7 wherein the GCLBJT is structured as a merged PMOS/PNP LBJT device, and is operated in the region Vgs> flatband voltage and Vgs<Vt whereby the PMOS device is operated in weak inversion, the thickness of the depletion layer being strongly dependent on the voltage across the gate and base region so that lateral PNP device characteristics are strongly dependent on the gate voltage.

* * * * *